United States Patent
Shin et al.

(10) Patent No.: US 7,467,345 B2
(45) Date of Patent: Dec. 16, 2008

(54) FAST H-ARQ ACKNOWLEDGEMENT GENERATION METHOD USING A STOPPING RULE FOR TURBO DECODING

(75) Inventors: Sung-Hyuk Shin, Fort Lee, NJ (US); Nader Bolourchi, Larchmont, NY (US)

(73) Assignee: Interdigital Technology Corporation, Wilmington, DE (US)

(*) Notice: Subject to any disclaimer, the term of this patent is extended or adjusted under 35 U.S.C. 154(b) by 86 days.

(21) Appl. No.: 11/491,410

(22) Filed: Jul. 21, 2006

(65) Prior Publication Data
US 2007/0168830 A1 Jul. 19, 2007

(51) Int. Cl.
*H03M 13/00* (2006.01)
(52) U.S. Cl. .................................. 714/755
(58) Field of Classification Search ............ 714/755, 714/786, 794, 795, 796, 748; 375/341
See application file for complete search history.

(56) References Cited

U.S. PATENT DOCUMENTS

| | | | |
|---|---|---|---|
| 6,182,261 B1 | 1/2001 | Haller et al. | |
| 6,266,795 B1 | 7/2001 | Wei | |
| 6,377,589 B1 | 4/2002 | Knight et al. | |
| 6,393,257 B1* | 5/2002 | Holtzman | 455/67.13 |
| 6,487,694 B1 | 11/2002 | Bajwa | |
| 6,518,892 B2 | 2/2003 | Shen et al. | |
| 6,557,139 B2 | 4/2003 | Böhnke | |
| 6,857,096 B1* | 2/2005 | Braneci et al. | 714/751 |
| 6,898,254 B2* | 5/2005 | Wolf et al. | 375/340 |
| 2001/0052104 A1* | 12/2001 | Xu et al. | 714/792 |
| 2002/0053058 A1 | 5/2002 | Lee et al. | |
| 2004/0006734 A1 | 1/2004 | Shin et al. | |

FOREIGN PATENT DOCUMENTS

| | | |
|---|---|---|
| JP | 11-017555 | 1/1999 |
| JP | 2001-127647 | 5/2001 |
| JP | 2002-111512 | 4/2002 |
| WO | 00/27037 | 9/2001 |
| WO | 03/069824 | 8/2003 |

OTHER PUBLICATIONS

Matache et al., "Stopping Rules for Turbo Decoders", TMO Progress Report, No. 42-142, Aug. 15, 2002, pp. 1-22.
Barbulescu et al., "Turbo Codes: a Tutorial on a New Class of Powerful Error Correcting Coding Schemes, Part 1 and Part 2", Small World Communications, Oct. 26, 1998, pp. 1-48.

(Continued)

*Primary Examiner*—James C Kerveros
(74) *Attorney, Agent, or Firm*—Volpe and Koenig, P.C.

(57) ABSTRACT

A stopping rule for Turbo decoding that is applied for both good and bad code blocks is disclosed. If the iteration either converges or diverges, decoding is terminated. In an alternative embodiment, the result of the stopping rule testing may be used for hybrid automatic repeat-request (HARQ) acknowledgement generation: if the iteration converges, an acknowledgment (ACK) is generated and if the iteration diverges, a negative acknowledgement (NACK) is generated. Optionally, the maximum number of decoding iterations may be dynamically selected based on modulation and coding scheme (MCS) levels.

18 Claims, 3 Drawing Sheets

OTHER PUBLICATIONS

Chen et al., "An Adaptive Hybrid FEC/ARQ Protocol Using Turbo Codes", IEEE International Conference on Universal Personal Communications, vol. 2, Conf. 6, Oct. 12, 1997, pp. 541-545.

Al-Mohandes, I.A. et al., "Iteration Reduction of Turbo Decoders Using an Efficient Stopping/Cancellation Technique," IEEE International Symposium on Circuits and Systems, ISCAS 2002, vol. 1, May 26-29, 2002, pp. I-609 - I-612.

Barbulescu, S.A. et al., "Turbo Codes: a Tutorial on a New Class of Powerful Error Correcting Coding Schemes, Part 1 and Part 2", Small World Communications, Oct. 26, 1998, pp. 1-48.

Chan, W. et al., "An Adaptive Hybrid FEC/ARQ Protocol Using Turbo Codes", IEEE International Conference on Universal Personal Communications, vol. 2, Conf. 6, Oct. 12, 1997, pp. 541-545.

Matache, A. et al., "Stopping Rules for Turbo Decoders", TMO Progress Report, No. 42-142, Aug. 15, 2002, pp. 1-22.

Shao, R.Y. et al., "Two Simple Stopping Criteria for Turbo Decoding," IEEE Transactions on Communications, vol. 47, No. 8, Aug. 1999, pp. 1117-1120.

Third Generation Partnership Project, "Technical Specification Group Radio Access Network; High Speed Downlink Packet Access; Physical Layer Aspects (Release 5)," 3GPP TR 25.858 V1.0.0 (Dec. 2001).

Third Generation Partnership Project, "Technical Specification Group Radio Access Network; High Speed Downlink Packet Access; Physical Layer Aspects (Release 5)," 3GPP TR 25.858 V5.0.0 (Mar. 2002).

Wu, Y. et al., "A Simple Stopping Criterion for Turbo Decoding," IEEE Communications Letters, vol. 4, No. 8, Aug. 2000, pp. 258-260.

* cited by examiner

US 7,467,345 B2

FAST H-ARQ ACKNOWLEDGEMENT GENERATION METHOD USING A STOPPING RULE FOR TURBO DECODING

CROSS REFERENCE TO RELATED APPLICATIONS

This application claims priority of U.S. patent application Ser. No. 10/334,490 filed Dec. 30, 2002 which in turn claims benefit of U.S. Provisional Patent Application No. 60/392,200, filed Jun. 28, 2002, now U.S. Pat. No. 7,093,180 which is incorporated by reference as if fully set forth herein.

FIELD OF INVENTION

The present invention is related to data communication systems. More particularly, the present invention is directed to an improved Turbo decoder in a data communication system.

BACKGROUND

Turbo codes are used for data communication systems [such as a High Speed Downlink Shared Channel (HS-DSCH) in High Speed Downlink Packet Access (HSDPA) in wireless communication systems] as a forward error connection (FEC) scheme. Decoding of Turbo codes is iterative in nature. That is, each Turbo code block is decoded several times. In general, there is a tradeoff between the Turbo code performance, which improves with the number of decoding iterations, and the decoding delay and computational complexity. Conventionally, the number of decoding iterations is fixed (for example, at 4 or 8 iterations). However, some Turbo code blocks may need only a few decoding iterations to successfully decode the code blocks, (i.e. to converge), before reaching the last decoding iteration and further iterations are not necessary. In such a case, if the Turbo decoder stops the redundant decoding iterations for the good blocks, it reduces the decoding delay and power consumption without degrading performance.

To prevent an endless loop when the stopping rule is never satisfied, the decoder stops after a maximum number of iterations. Several stopping rules for Turbo decoding have been addressed in the prior art. However, prior art stopping rules are focused on the case where decoding iterations converge (e.g., for good Turbo coded blocks).

SUMMARY

The present invention not only implements a stopping rule for good code blocks, but also includes a stopping rule for bad code blocks which fail to be correctly decoded even at the last decoding iteration. This benefits data communication systems such as HSDPA which employ an H-ARQ (hybrid-automatic repeat request) protocol, since the H-ARQ protocol requests bad blocks to be retransmitted. It is particularly applicable with HS-DSCHs with H-ARQ that may require raw block error rates (BLERs) before retransmission on the order of $10^{-1}$, which leads to frequent occurrences of bad Turbo coded blocks for HS-DSCH. It should be noted that although the present invention will focus on HSDPA as an example, other data communication system using Turbo coding and an H-ARQ technique may also be used in accordance with the teachings of the present invention.

The H-ARQ protocol used for HSDPA sends the transmitter an acknowledgement (ACK/NACK) of each H-ARQ process where generation of the acknowledgement is typically based on the cyclic redundancy check (CRC) check result of the individual H-ARQ process. There is some delay in deriving the CRC result, which may be on the order of 10 msec. The CRC processing delay may cause H-ARQ performance degradation. As an alternative to the H-ARQ acknowledgement generation, the result of the stopping rule testing may be used to determine whether a given H-ARQ process is in error (NACK generation) or error-free (ACK generation).

In addition, HSDPA employs adaptive modulation and coding (AMC) as a link adaptation technique. The modulation and coding format can be changed on a radio frame basis in accordance with variations in the channel conditions, subject to system restrictions. In order to more efficiently implement the Turbo decoder with a stopping rule, the maximum number of Turbo decoding iterations may be dynamically selected depending on a code rate and modulation type for the HS-DSCH.

The present invention provides the advantage of a reduction in the decoding delay and computational complexity at the user equipment (UE) receiver. In addition, reduction in the decoding delay leads to earlier availability of H-ARQ acknowledgements at the Node B, which improves HSDPA performance.

BRIEF DESCRIPTION OF THE DRAWINGS

The present invention will be described with reference to the drawing figures wherein like numerals represent like elements throughout and wherein.

DETAILED DESCRIPTION OF THE PREFERRED EMBODIMENTS

Figure 1:
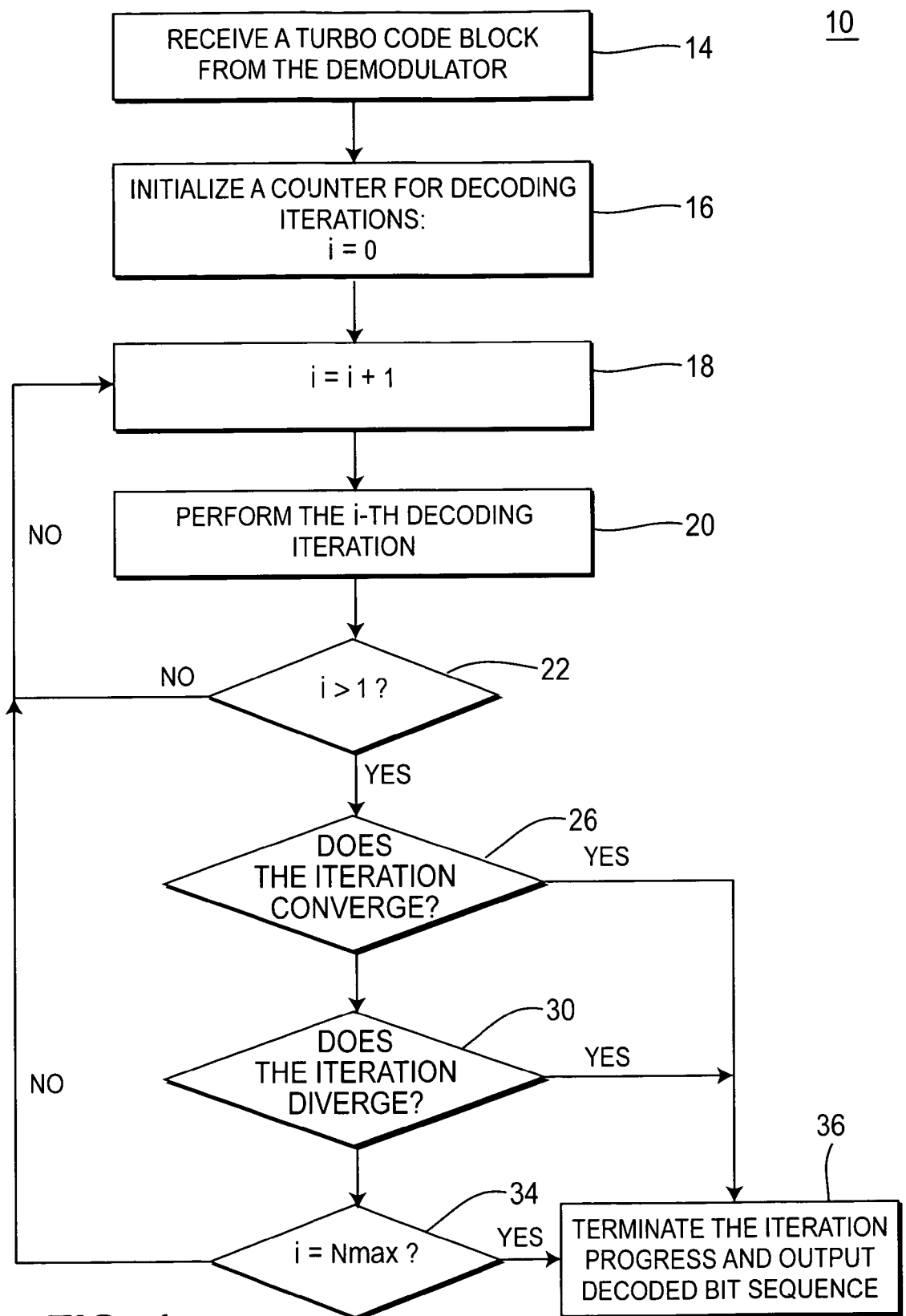
FIGS. 1 and 2 are flow diagrams useful in describing alternative techniques of the present invention.

The stopping rule known as Sign Change Ratio (SCR) is implemented for Turbo decoding in accordance with the present invention. This rule depends upon the sign changes of the extrinsic information provided by the component decoders in the Turbo decoder between the $(k-1)^{th}$ and $k^{th}$ iterations for both good and bad Turbo code blocks. The conventional SCR stopping rule attempts to determine, by checking the sign changes, when the iteration converges and then terminates the iteration process. This SCR stopping rule is applied only to good received code blocks. However, in accordance with the present invention, the SCR stopping rule is applied to bad code blocks as well. This especially benefits HSDPA systems employing a H-ARQ protocol, since the H-ARQ protocol requests bad H-ARQ processes consisting of Turbo code block(s) to be retransmitted. It should be noted that although the present invention will focus on the SCR based stopping rule as an example, other stopping criterion may also be used in accordance with the teachings of the present invention. By way of example, other known stopping criteria include: (a) CRC wherein, after each decoding iteration, CRC bits are checked for errors and the iteration is stopped if there is no CRC error and (b) Cross Entropy wherein after each iteration, the cross entropy between log-likelihood ratios of the component decoders is calculated and the iteration is terminated if the estimated cross entropy is less than a given threshold.

To see the behavior of iterative decoding in the Turbo decoder, Turbo code simulations were performed with a fixed number of iterations k where k is (set to 8). Table 1 shows typical samples of the simulation results in terms of the number of sign changes at each iteration for good Turbo code blocks, and Table 2 shows typical samples of the simulation results in terms of the number of sign changes at each iteration for bad Turbo code blocks. As observed in Table 1, with good code blocks the number of sign changes between (k−1) and k (for k>1) iterations converges before the last ($8^{th}$) iteration. In this case, if the stopping rule is applied, the average number of iterations would be reduced to approximately 4.

TABLE 1

Typical samples of TC simulation results in terms of the
number of sign changes for successful decoded (good) blocks
when 16 QAM, ¾ rate, BLER = 10% of sign changes between (k − 1) and k iterations

| Blocks | K = 2 | K = 3 | K = 4 | K = 5 | K = 6 | K = 7 | K = 8 | Stopped iteration |
|---|---|---|---|---|---|---|---|---|
| 1 | 3 | 0 | 0 | 0 | 0 | 0 | 0 | K = 3 |
| 2 | 8 | 3 | 0 | 0 | 0 | 0 | 0 | K = 4 |
| 3 | 16 | 9 | 0 | 0 | 0 | 0 | 0 | K = 4 |
| 4 | 4 | 8 | 7 | 3 | 0 | 0 | 0 | K = 6 |
| 5 | 11 | 2 | 0 | 0 | 0 | 0 | 0 | K = 4 |
| 6 | 18 | 20 | 11 | 10 | 0 | 0 | 0 | K = 6 |
| 7 | 19 | 5 | 0 | 0 | 0 | 0 | 0 | K = 4 |
| 8 | 16 | 9 | 0 | 0 | 0 | 0 | 0 | K = 4 |
| 9 | 4 | 5 | 3 | 0 | 0 | 0 | 0 | K = 5 |
| 10 | 10 | 0 | 0 | 0 | 0 | 0 | 0 | K = 3 |

In Table 2, it is shown that with bad code blocks the number of sign changes never converges.

TABLE 2

Typical samples of TC simulation results in terms of the
number of sign changes for unsuccessfully decoded (bad) blocks
when 16 QAM, ¾ rate, BLER = 10% of sign changes between (k − 1) and k iterations

| Blocks | K = 2 | K = 3 | K = 4 | K = 5 | K = 6 | K = 7 | K = 8 | Stopped iteration |
|---|---|---|---|---|---|---|---|---|
| 1 | 30 | 39 | 29 | 37 | 46 | 49 | 31 | K = 3 |
| 2 | 24 | 36 | 39 | 39 | 38 | 35 | 28 | K = 3 |
| 3 | 33 | 27 | 24 | 23 | 24 | 14 | 17 | K = 8 |
| 4 | 11 | 11 | 12 | 20 | 21 | 37 | 34 | K = 5 |
| 5 | 9 | 14 | 9 | 8 | 11 | 9 | 16 | K = 3 |
| 6 | 18 | 10 | 7 | 9 | 17 | 14 | 7 | K = 5 |
| 7 | 3 | 34 | 39 | 38 | 39 | 23 | 25 | K = 3 |
| 8 | 16 | 14 | 34 | 36 | 12 | 22 | 35 | K = 4 |

In the present invention, it is proposed that the iterative decoding process is terminated if either the iteration converges or the iteration diverges. Otherwise the decoding ceases after a maximum number of iterations.

Referring to FIG. 1, a flowchart of the method 10 in accordance with the present invention for Turbo decoding is shown. The method 10 commences by receiving a Turbo code block from a demodulator (step 14). A counter for decoding iterations is then initialized (i=0) (step 16) and then the counter incremented (i=i+1) (step 18). The ith decoding iteration is performed (step 20) and it is determined whether or not this is the first iteration (step 22). If it is the first iteration, the procedure 10 reverts to step 18. If not, the method 10 makes a determination of whether or not the iteration converges or diverges.

If the SCR is considered as the stopping criterion, then the iteration convergence and divergence can be defined as follows. If the number of the sign changes between the $(k-1)^{th}$ iteration and $k^{th}$ iteration (for k>1) becomes zero, the iteration is determined to be converging. If the number of the sign changes between the $(k-1)^{th}$ iteration and $k^{th}$ iteration (for k>2) is greater than that between the $(k-2)^{th}$ iteration and $(k-1)^{th}$ iteration, the iteration is determined to be diverging. Accordingly, at step 26, it is determined whether the iteration converges. If so, the iteration process is terminated and the decoded sequence is output (step 36). If not, it is determined whether the iteration diverges (step 30). If the iteration diverges, the iteration process is terminated and the decoded sequence is output (step 36). If the iteration does not diverge, it is determined whether the maximum number of iterations (i=Nmax) has been reached (step 34). If so, the iteration process is terminated and the decoded bit sequence is output (step 36). If not, the process returns to step 18 whereby the counter is incremented (i=i+1) and steps 20-36 are repeated. It should be noted that the maximum number of iterations Nmax may be dynamically selected as a function of the applied code rate and modulation type. For example, the higher the code rate and the higher the order of the modulation type, the less the maximum number of iterations Nmax.

Figure 2:
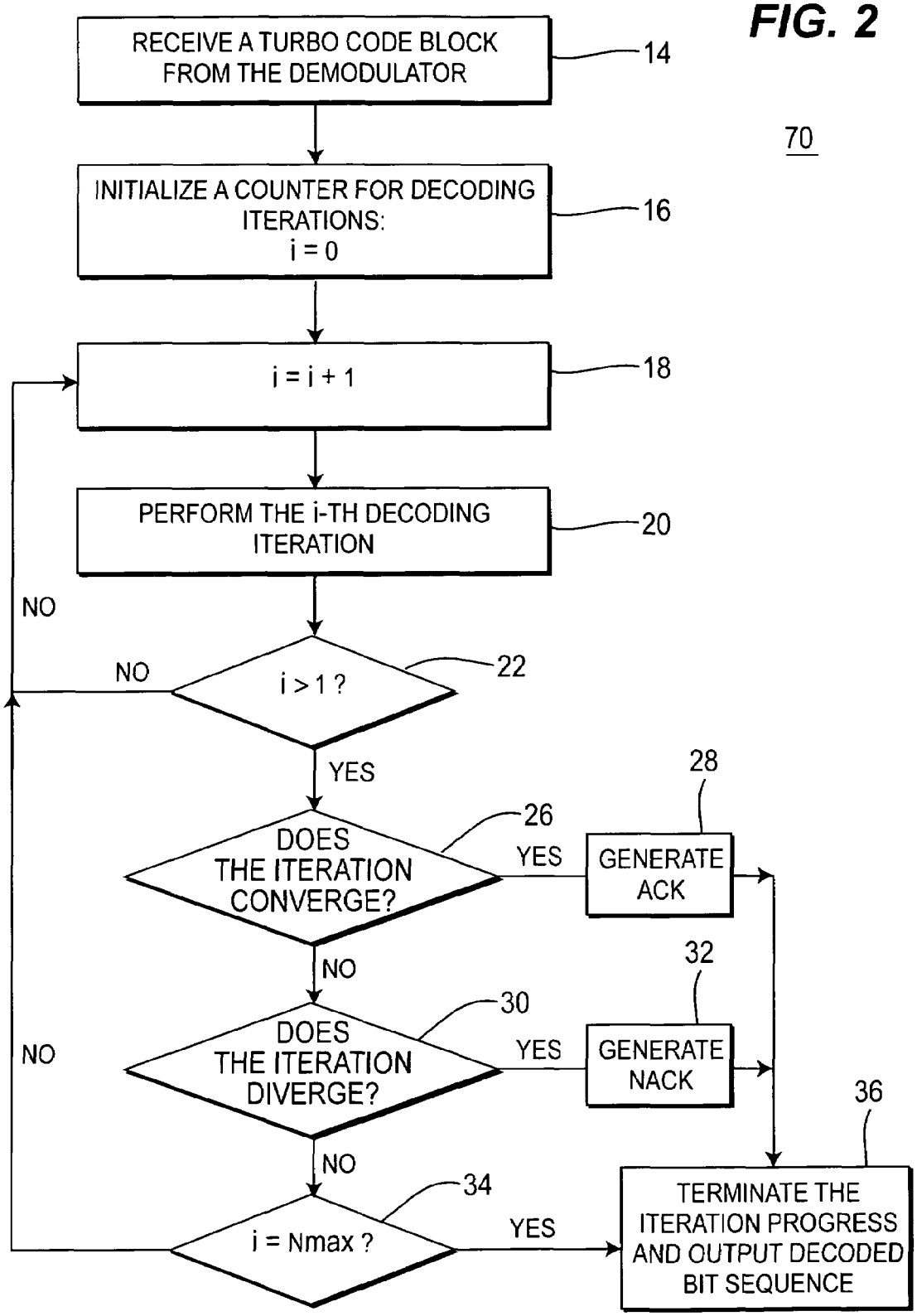

FIG. 2 is a flow chart of an alternative method 70 in accordance with the present invention for Turbo decoding. In this embodiment 70, the results of the stopping rule are used for H-ARQ acknowledgement generation. The like steps of the method 70 shown in FIG. 2 are numbered the same as the steps of the procedure 10 shown in FIG. 1 and therefore will not be further described with reference to FIG. 2.

In accordance with this embodiment of the present invention, after a determination of whether or not the iteration converges, an acknowledgement (ACK) or non-acknowledgement (NACK) for H-ARQ is generated. More specifically, referring to step 26, if it is determined that the iteration converges (step 26), an ACK is generated (step 28) assuming that an H-ARQ process has a single Turbo code block. When there are multiple Turbo code blocks in an H-ARQ process, the ACK for the H-ARQ process will be generated, if all the iterations with all the code blocks converge. The iteration process is then terminated and the decoded bit sequence is output (step 36). If the iteration does not converge as determined at step 26, it is then determined whether or not the iteration diverges (step 30). If so, a NACK is generated (step 32) for the H-ARQ process carrying the decoded block, the iteration process is terminated and the decoded bit sequence is output (step 36). When there are multiple Turbo code blocks in an H-ARQ process, if any one code block is determined to be dive (generating NACK), then all the iterations with other relevant code blocks may be terminated as well. If the iteration does not diverge, as determined at step 30, it is determined whether or not the iteration has reached the maximum number of iterations Nmax (step 34). If so, the. iteration process is terminated and the decoded sequence is output (step 36). If the maximum number of iterations Nmax has not been reached, as determined at step 34, the counter is incremented (step 18) and steps 20-36 are repeated. Accordingly, if the iteration process does not converge or diverge, the H-ARQ acknowledgement generation will be based on CRC check results as in the prior art. The use of the Turbo decoding aided H-ARQ acknowledgement generation may reduce H-ARQ processing delay at the receiving station, taking into account the delay in CRC processing (on the order of 10 msec).

Figure 3:
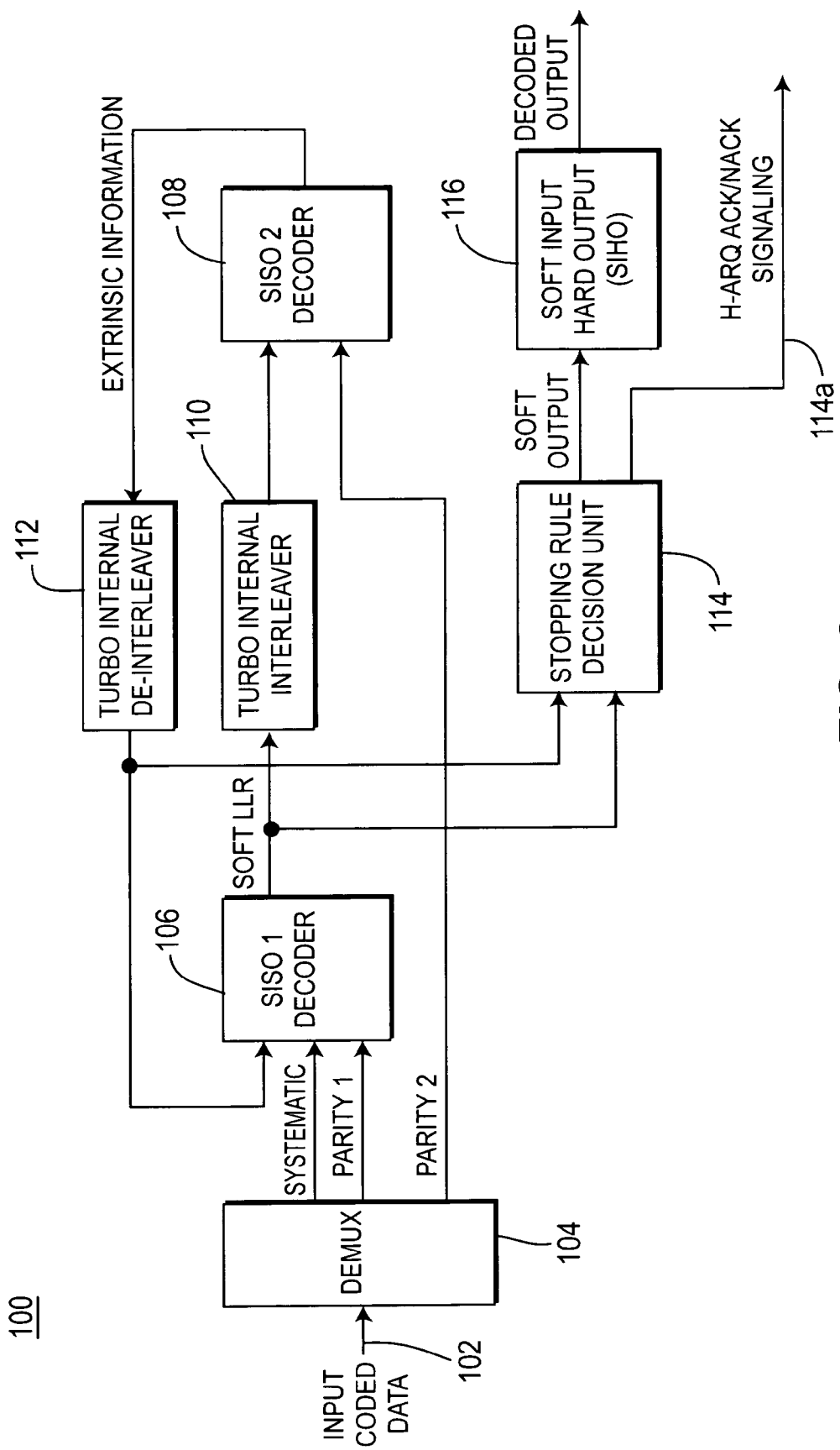
FIG. 3 is a modified block diagram showing apparatus utilized to perform the turbo decoding technique of the present invention.

In FIG. 3, a block diagram of the Turbo decoder structure 100 is shown, including the stopping rule decision unit. In general, the Turbo decoder 100 consists of (2) two SISO (soft input soft output) modules, SISO1 106 and SISO2 108. Each SISO provides soft-valued log-likelihood ratios (LLR) for the other SISO through the Turbo internal interleaver/de-interleaver 110, 112. After each iteration, a stopping rule decision unit 114 checks whether the decoding iteration converges or diverges, or neither. If the decision turns out to be either "converged" or "diverged", the iteration is stopped and either "Ack" or "Nack" indication depending on convergence or divergence is generated for H-ARQ processing. Otherwise, the decoder continues the iteration.

More specifically, the Turbo decoder 100 processes soft-valued input data 102 in each Turbo code block in a transmission. The input 102 to the Turbo decoder is passed through a demultiplexer 104 which separates the input into three sequences: systematic bit sequence, parity bit 1 sequence, and parity bit 2 sequence. The systematic bit sequence and parity bit 1 sequence are initially sent to the SISO 1 decoder 106 (soft-input soft-output decoder), along with a priori information data derived from the SISO 2 decoder 108. The SISO 1 decoder 106 generates log-likelihood ratios (LLRs) (i.e. extrinsic information plus systematic information) of the information bits. The LLRs from the SISO 1 decoder 106 are permuted by a Turbo internal interleaver 110 and passed to the SISO 2 decoder 108. Along with the interleaved LLRs, the parity bit 2 sequence is fed into the SISO 2 decoder 108. The extrinsic information output of the SISO 2 decoder are deinterleaved in accordance with the Turbo internal deinterleaver 112 performing an inverse permutation with respect to the Turbo internal interleaver 110. The permuted extrinsic information is then fed back as the a priori information of the SISO 1 decoder 106 to repeat the process. After each iteration, the stopping rule decision unit 114 determines whether the iteration converged, diverged or neither converged or diverged. If the decision turns out to be either "converged" or "diverged," the iteration is stopped, the decoded bit sequence is output at 116, and a corresponding H-ARQ acknowledgement is provided at 114*a* for H-ARQ processing. Otherwise the process continues to be iterated.

The present invention provides the advantage of a reduction in the decoding delay and computation complexity at the receiving station. In addition, a decrease of the decoding delay leads to make H-ARQ acknowledgements available earlier at the transmission, which improves H-ARQ performance.

Although the present invention has been described in detail, it is to be understood that the invention is not limited thereto, and that various changes can be made therein without departing from the spirit and scope of the invention, which is defined by the attached claims.

What is claimed is:

1. A method employed in an iterative turbo decoder, the method comprising:
    determining if a later decoding iteration diverges by comparing the later decoding iteration to one or more earlier decoding iterations; and
    terminating performance of further iterations if it is determined that the later decoding iteration diverges.

2. The method of claim 1, further comprising:
    generating an acknowledgment (NACK) indicating a bad code block when it is determined that the later decoding iteration diverges.

3. The method of claim 1, further comprising:
    determining if the later decoding iteration converges by comparing the later decoding iteration to the one or more earlier decoding iterations; and
    terminating performance of further iterations if it is determined that the later decoding iteration converges.

4. The method of claim 3, further comprising:
    generating an acknowledgement (ACK) indicating a good code block when it is determined that the later decoding iteration converges.

5. The method of claim 3, further comprising:
    terminating performance of further decoding iterations in the event that neither divergence nor convergence is determined when an iteration count reaches a predetermined threshold.

6. The method of claim 3, wherein making the convergence determination includes evaluating a sign change ratio between the later decoding iteration and the one or more earlier decoding iterations.

7. The method of claim 6, wherein if the sign change ratio is zero, the later decoding iteration is converging.

8. The method of claim 1, wherein making the divergence determination includes evaluating a sign change ratio between the later decoding iteration and the one or more earlier decoding iterations.

9. The method of claim 8, wherein if the sign change ratio is increasing, the later decoding iteration is diverging.

10. A wireless transmit/receive unit (WTRU) comprising:
    a decoder for iteratively decoding a turbo code block;
    a stopping rule decision unit configured for determining if a later decoding iteration diverges by comparing the later decoding iteration to one or more earlier decoding iterations, and for terminating the iterative decoding if it is determined that the later decoding iteration is diverging.

11. The WTRU of claim 10, wherein the stopping rule decision unit is further configured to generate an acknowledgement (NACK) indicating a bad code block when it is determined that the later decoding iteration diverges.

12. The WTRU of claim 10, wherein the stopping rule decision unit is further configured to determine if the later decoding iteration converges by comparing the later decoding iteration to the one or more earlier decoding iterations, and for terminating performance of further iterations if it is determined that the later decoding iteration converges.

13. The WTRU of claim 12, wherein the stopping rule decision unit is further configured to generate an acknowledgement (ACK) indicating a good code block when it is determined that the later decoding iteration converges.

14. The WTRU of claim 12, wherein the stopping rule decision unit is further configured to terminate performance of further decoding iterations in the event that neither divergence nor convergence is determined when an iteration count reaches a predetermines threshold.

15. The WTRU of claim 12, wherein the stopping rule decision unit is configured to make the convergence determination by evaluating a sign change ratio between the later decoding iteration and the one or more earlier decoding iterations.

16. The WTRU of claim 15, wherein if the sign change ratio is zero, the later decoding iteration is converging.

17. The WTRU of claim 10, wherein the stopping rule decision unit is configured to make the divergence determination by evaluating a sign change ratio between the later decoding iteration and the one or more earlier decoding iterations.

18. The WTRU of claim 17, wherein if the sign change ratio is increasing, the later decoding iteration is diverging.

* * * * *

UNITED STATES PATENT AND TRADEMARK OFFICE
CERTIFICATE OF CORRECTION

PATENT NO. : 7,467,345 B2
APPLICATION NO. : 11/491410
DATED : December 16, 2008
INVENTOR(S) : Shin et al.

It is certified that error appears in the above-identified patent and that said Letters Patent is hereby corrected as shown below:

ON THE FACE PAGE

After section (65) insert
--(63) Related U.S. Application Data
Continuation of application No. 10/334,490, filed on Dec. 30, 2002, which is a provisional of application 60/392,200, filed on Jun. 28, 2002.--.

At section (56), OTHER PUBLICATIONS, page 2, left column, line 1, before "et al., "An Adaptive", delete "Chen" and insert therefor --Chan W.--.

IN THE SPECIFICATION

At column 1, lines 26 & 27, after the word "error" delete "connection" and insert therefor --correction--.

At column 1, line 62, after the word "communication" delete "system" and insert therefor --systems--.

At column 4, line 47, after the words "to be" delete "dive" and insert therefor --diverging--.

At column 5, line 31, after the word "converged" delete "or" and insert therefor --nor--.

UNITED STATES PATENT AND TRADEMARK OFFICE
CERTIFICATE OF CORRECTION

PATENT NO.       : 7,467,345 B2
APPLICATION NO.  : 11/491410
DATED            : December 16, 2008
INVENTOR(S)      : Shin et al.

It is certified that error appears in the above-identified patent and that said Letters Patent is hereby corrected as shown below:

IN THE CLAIMS

At claim 14, column 6, line 49, after the words "reaches a" delete "predetermines" and insert therefor --predetermined--.

Signed and Sealed this

Twentieth Day of October, 2009

David J. Kappos
*Director of the United States Patent and Trademark Office*